United States Patent
Brennan et al.

(10) Patent No.: US 7,369,385 B2
(45) Date of Patent: May 6, 2008

(54) OVERLOAD LIMITING CIRCUIT

(75) Inventors: Oliver James Brennan, Adare (IE); Dennis Arnold Dempsey, Crecora (IE)

(73) Assignee: Analog Devices, Inc., Norwood, MA (US)

( * ) Notice: Subject to any disclaimer, the term of this patent is extended or adjusted under 35 U.S.C. 154(b) by 131 days.

(21) Appl. No.: 10/308,364

(22) Filed: Dec. 3, 2002

(65) Prior Publication Data

US 2004/0008463 A1    Jan. 15, 2004

Related U.S. Application Data

(60) Provisional application No. 60/394,637, filed on Jul. 9, 2002.

(51) Int. Cl.
    *H02H 9/08* (2006.01)
(52) U.S. Cl. .................................. 361/93.1; 361/93.9
(58) Field of Classification Search ................. 361/90, 361/91.1, 91.2, 91.3, 93.1, 93.2, 103, 93.7–93.9
    See application file for complete search history.

(56) References Cited

U.S. PATENT DOCUMENTS

| | | | |
|---|---|---|---|
| 4,342,065 A | 7/1982 | Larson | |
| 4,551,779 A * | 11/1985 | Murakami et al. | 361/86 |
| 4,581,540 A * | 4/1986 | Guajardo | 307/117 |
| 4,686,383 A * | 8/1987 | Croft | 327/198 |
| 4,686,436 A * | 8/1987 | Archer | 318/254 |
| 4,791,522 A | 12/1988 | Bergh | |
| 4,875,000 A * | 10/1989 | Fry et al. | 318/798 |
| 4,884,165 A | 11/1989 | Kong et al. | |
| 5,159,516 A * | 10/1992 | Fujihira | 361/18 |
| 5,256,914 A | 10/1993 | Boomer | |
| 5,550,702 A * | 8/1996 | Schmidt et al. | 361/103 |
| 5,606,482 A * | 2/1997 | Witmer | 361/93.7 |
| 5,737,169 A * | 4/1998 | Sellers | 361/98 |
| 5,808,477 A | 9/1998 | Gola et al. | |
| 5,943,205 A * | 8/1999 | Erckert et al. | 361/93.1 |
| 5,969,926 A | 10/1999 | Whittaker | |
| 6,034,857 A | 3/2000 | Sample et al. | |
| 6,222,716 B1 * | 4/2001 | Chiang et al. | 361/103 |
| 6,339,236 B1 * | 1/2002 | Tomii et al. | 257/228 |

* cited by examiner

*Primary Examiner*—Michael Sherry
*Assistant Examiner*—Danny Nguyen
(74) *Attorney, Agent, or Firm*—Iandiorio Teska & Coleman

(57) ABSTRACT

An overload current limiting circuit includes an output control circuit responsive to a logic input signal for generating a control signal for driving an output device to produce at an output terminal a signal representative of the logic input signal; and a sense circuit for sensing voltage at the output terminal indicative of a current overload and diverting a portion of that current to change the control signal to the output device to limit the overload current.

19 Claims, 2 Drawing Sheets

OVERLOAD LIMITING CIRCUIT

RELATED APPLICATIONS

This application claims priority of U.S. provisional application Ser. No. 60/394,637 filed Jul. 9, 2002.

FIELD OF THE INVENTION

This invention relates to an overload limiting circuit and more particularly to such an overload limiting circuit which senses voltage indicative of a current overload and diverts a portion of the current to change a control signal to the effected device.

BACKGROUND OF THE INVENTION

Overload current limiting circuits, especially short circuit current limiting circuits are used in digital output drivers which use large transistors to drive output loads to specified voltage levels at adequate speed. As a result of the drive and timing requirements digital output drivers can deliver excessive current, if, because of a fault there is established a low impedance path to a supply reference voltage level on a system coupled to the output of a large transistor.

One example of such a high current condition is where an output driver is being driven by a logic high and therefore its output is coupled to a logic high rail by an output transistor. If the output is then shorted to logic low by a fault condition the pull up transistor may supply excessive current. This excessive current could damage its output transistor and therefore this current should be limited. It should be noted that short circuit conditions can also occur to logic high rails when being driven low and indeed shorts resulting in excessive currents can occur to different voltage levels than supply rails.

Various attempts have been made to reduce overload currents in order to prevent damage to the circuits and components. In one approach, a digital comparison is made of the output voltage on a digital buffer versus its input voltage and then the driver is put into a low current state either by "three stating" the output or flipping over the output driver to drive it to the correct logic level. A disadvantage of this approach is that after removing of the short circuit condition an explicit reset function has to be carried out to return the output voltage/logic state to its normal value.

In another approach two sense amplifiers are designed to have certain trip points to detect a high current state when faulted to a low or high output voltage. This approach requires a parallel weaker secondary driver device to enable the circuit to correct the logic state after removal of the high current state. A disadvantage is the fact that at least one of the secondary drivers is on at all times in normal operation. Another design monitors the output voltage of a digital output driver versus its input logic state and "three states" the output if a fault condition is detected. A refresh loop periodically refreshes the fault detection circuitry thereby returning the output to the correct state after the fault condition has been removed. But the refresh loop is relatively complex and consumes extra power and requires substantial area.

In still another approach, the output current is mirrored in a parallel sense path. If the sense current is greater than a reference value, the drive of the output transistor is restricted. The current feedback paths in these circuits are relatively complex, consume considerable power, and require careful design for stability. In addition, an analog reference current must be generated which is in itself a substantial task.

In still another approach, the gate drive of an output transistor is clamped when it is delivering high current in a fault state by using two series connected transistors. These transistors both conduct to clamp the voltage at the output node of the digital buffer. However, it is difficult to totally shut off this large driving transistor without consuming high current in the sensing path and if the gate drive is limited too much, the output node will remain clamped even when the short circuit is removed.

BRIEF SUMMARY OF THE INVENTION

It is therefore an object of this invention to provide an improved overload current limiting circuit.

It is a further object of this invention to provide such an improved overload current limiting circuit which consumes virtually no power in the normal state.

It is a further object of this invention to provide such an improved overload current limiting circuit which is biased and powered by the voltage/current at the output terminal experiencing the fault.

It is a further object of this invention to provide such an improved overload current limiting circuit which automatically recovers to the normal state when the fault is removed.

It is a further object of this invention to provide such an improved overload current limiting circuit which used minimum additional circuit complexity and size.

The invention results from the realization that a truly elegant and efficient overload current limiting circuit which consumes virtually no power in normal operation and automatically resets itself after the fault is removed can be achieved with a sensing circuit that senses a voltage indicative of an overload current, and diverts a portion of that current during an overload condition or state to change the control signal to shut down the overloaded circuit and then returns to normal when the overload current subsides.

This invention features an overload current limiting circuit including an output control circuit responsive to a logic input signal for generating a control signal for driving an output device to produce at an output terminal an output signal representative of the logic input signal. There is a sense circuit responsive to the logic input signal and the output signal for sensing voltage at the output terminal indicative of a current overload and diverting a portion of that current to the output control circuit to change the control signal to the output device to limit the overload current.

This invention also features an overload current limiting circuit including an output control circuit responsive to a logic input signal for generating a control signal for driving an output device to produce at an output terminal a signal representative of the logic input signal. There is a sense circuit for sensing voltage at the output terminal indicative of a current overload and diverting a portion of that current to the output control circuit to change the control signal to the output device to limit the overload current and cease diverting that current and return to the original control signal and automatically reset the circuit when the overload current subsides.

In a preferred embodiment, the signal representative of the logic input signal may be the same as the logic input signal. The sense circuit may include a transistor with its gate electrode responsive to the logic input signal and its primary electrodes connected in series between the output terminal and the output control circuit. There may be a delay line for delaying application of the logic input signal to the gate. The delay line may be analog or digital. The control signal may be a logic level signal. The output device may include a differential pair of transistors. The output control circuit may change the control signal to turn off the one of the pair of differential transistors which is on at the occurrence of the overload current.

The invention also features an overload current limiting circuit including an output control circuit responsive to a logic input signal for generating a control signal for driving an output device including a differential transistor pair to produce at an output terminal a signal representative of the logic input signal. A sense circuit senses the voltage of the output terminal indicative of a current overload and diverts a portion of that current to the output control circuit to change the control signal to the output device to limit the overload current to the one of the differential transistors that is conducting and cease diverting that current and return to the original control signal when the overload state/current subsides. dr

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
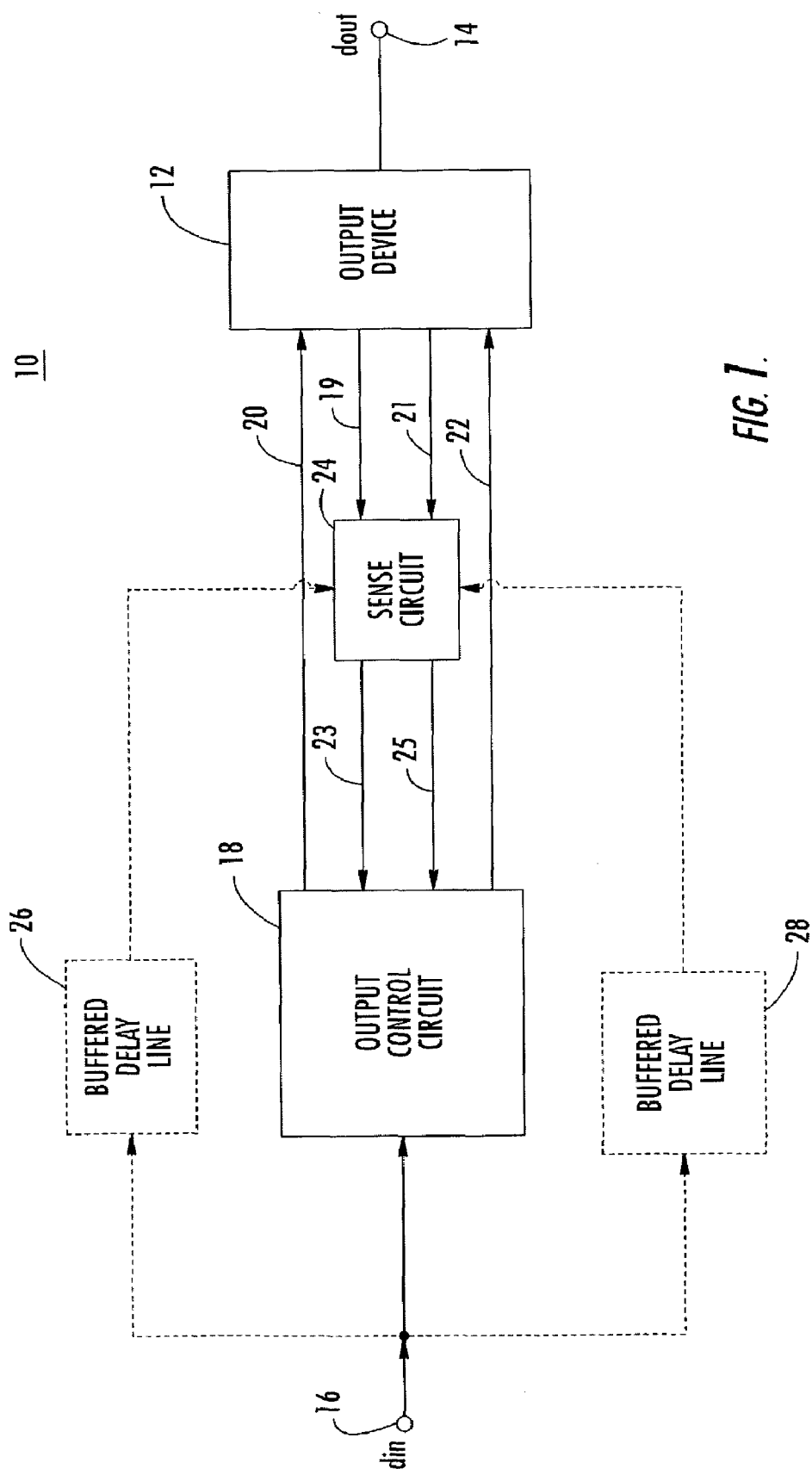
FIG. 1 is schematic block diagram of an overload current limiting circuit according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 an overload current limiting circuit 10 according to this invention including an output device 12 which provides either a high or a low output at terminal 14 depending upon the condition of the input on terminal 16. The entire system may be constructed so that $d_{out}$ at 14 represents the signal $d_{in}$ at input terminal 16 or the opposite of the signal $d_{in}$ at input terminal 16. Output control 18 responds to the logic level at input terminal 16 to provide the appropriate signal on lines 20 and 22 to drive output device 12 to produce the output signal $d_{out}$ on output terminal 14. Sense circuit 24 senses over lines 19 and 21 the condition of the output device 12 and upon sensing an output current provides an input on lines 23 and 25 to output control circuit 18 to change the signals on lines 20 and 22 as appropriate to reduce or eliminate the overload current. Buffered delay lines 26 and 28 may be provided to ensure proper timing of the operation of output device 12 and sense circuit 24. Delay lines 26 and 28 may be either analog or digital and need not be buffered. Although overload current limiting circuit 10 is shown as a differential circuit it may as well be a single ended circuit, for example by eliminating the upper or lower half associated with lines 19, 20, and 23 or 21, 22 and 25, respectively.

Figure 2:
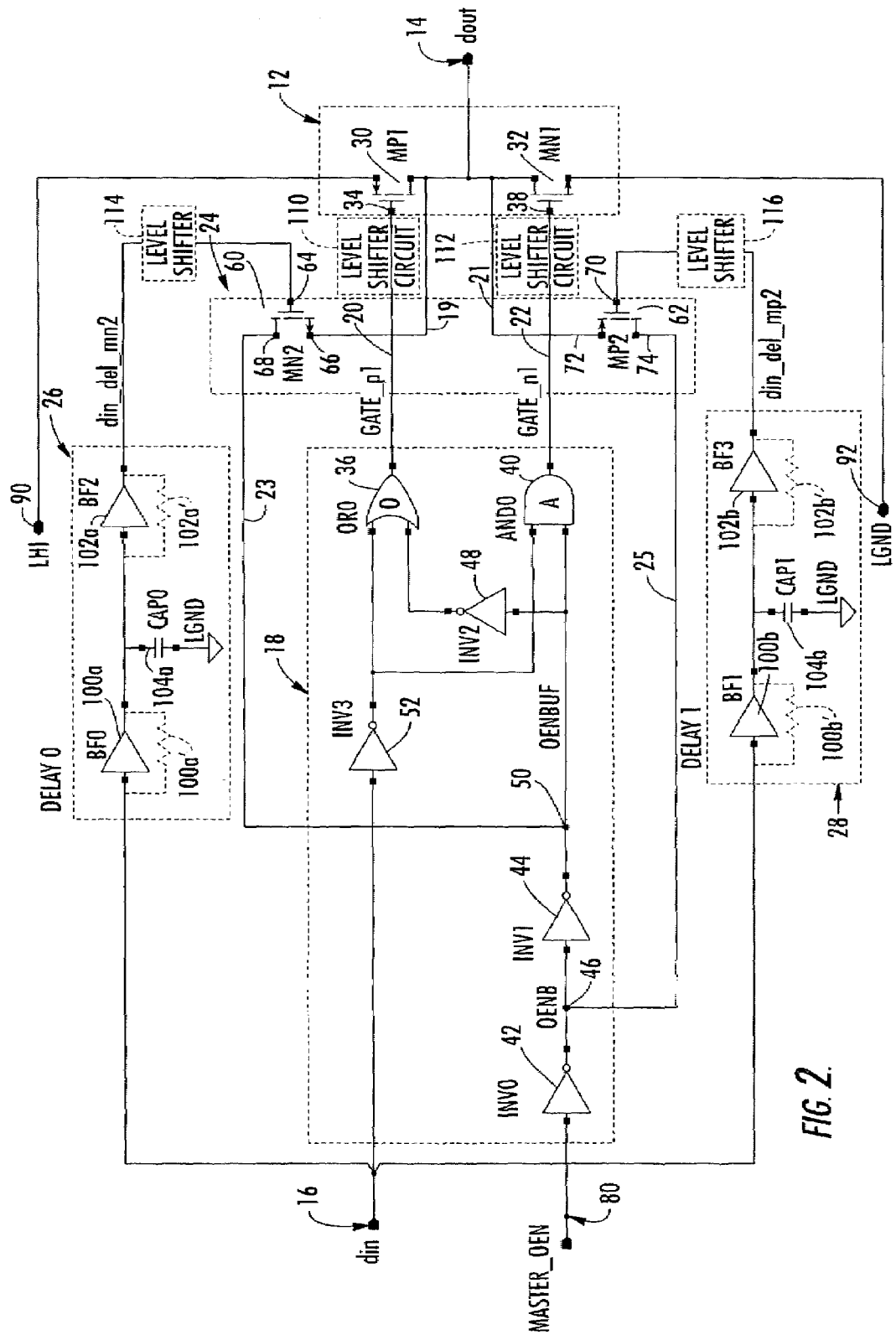
FIG. 2 is a more detailed schematic diagram of the overload current limiting circuit of FIG. 1.

In one embodiment, FIG. 2, output device 12 includes a pair of differentially connected transistors 30 and 32. Transistor 30 is shown as a PMOS transistor and transistor 32 is shown as a NMOS transistor. Gate 34 of transistor 30 is connected through line 20 to OR gate 36 in output control circuit 18. Gate 38 of transistor 32 is connected over line 22 to AND gate 40 in output control circuit 18. Also included in output control circuit 18 are inverters 42 and 44 between which occurs node 46. Inverter 48 receives an input from node 50 at the output of inverter 44. Inverter 52 receives input directly from input terminal 16. OR gate 36 receives one input from the output of inverter 52 the other from the output of inverter 48. AND gate 40 receives one input from the output of inverter 52 and the other from node 50 at the output of inverter 44.

Sense circuit 24 includes NMOS transistor 60 and PMOS transistor 62. Transistor 60 has its gate 64 connected either directly or preferably through delay line 26 to input terminal 16. Its primary terminals, in this case source 66 and drain 68, are coupled to output terminal 14 and node 50 in output control circuit 18, respectively. Transistor 62 has its gate 70 connected either directly or through delay line 28 to input terminal 16 and its source 72 and drain 74, connected in series to output terminal 14 and node 46 in output control circuit 18, respectively. A master output enable terminal 80 is provided so that in addition to having one state where transistor 30 conducts and transistor 32 does not, and a second state where transistor 32 conducts and transistor 30 does not, there is a third state in which neither conducts (a "three state" device). Thus a low logic level on master output enable terminal 80 is converted to a high level by inverter 42 and back to a low level in inverter 44. This low level appearing at node 50 disables AND gate 40 providing a low level to gate 38 of transistor 32 so that it can not conduct. The low level at node 50 is provided to inverter 48 which provides the inverted high level of its output which passes through OR gate 36 to gate 34 of transistor 30. The high level at gate 34 of transistor 30 prevents it from conducting and in this way turns off both transistors 30 and 32 and establishes the third state. Alternatively, instead of applying a master output enable (master-oen) signal at terminal 80, terminal 80 could be permanently biased high by a high level such as logic high (LHI) on terminal 90.

In operation, assuming that the input signal $d_{in}$ is high at input terminal 16, inverter 52 produces a low level at its output and a low level to OR gate 36. The master output enable signal at terminal 80 being high produces a low signal at node 46 and, a high signal at 50, which is converted by inverter 48 to a low signal at the input of OR gate 36. Since neither one of the inputs to OR gate 36 are high, that is both are low, the low input to gate 34 enables transistor 30 to conduct. When it conducts it essentially couples the high voltage LHI at rail 90 to the output terminal 14. At this time transistor 32 is off or substantially not conducting. This is so because the high level at terminal 80 which appears at node 50 is applied to one input of AND gate 40. The high level at input 16, however, appears as a low level at the output of inverter 52 and is delivered as a low level to AND gate 40. With AND gate 40's output disabled, the low level at gate 38 prevents transistor 32 from conducting.

When $d_{in}$ is presented as a low level signal at input terminal 16, the output of inverter 52 is high. This high level signal passing through OR gate 36 provides a high level at gate 34 and disables transistor 30 even though inverter 48 is still supplying a low level to the other input of OR gate. As long as one input is high, the output of OR gate 36 will be high, and so transistor 30 will be disabled. This high level output from inverter 52, however, is delivered to AND gate 40, which in conjunction with the high level at node 50 produced by the high level of master output enable circuit in terminal 80 enables gate 40 to pass a high logic level signal to gate 38 and so transistor 32 conducts. With transistor 32 conducting, output terminal 14 is essentially at the level LGND of the low rail 92.

At this point transistor 60 (an NMOS transistor) is not conducting as its gate 64 and source 66 are at the same voltage: in order to conduct the voltage of gate 64 must be higher than that of source 66. Conversely, with respect to transistor 62 (a PMOS transistor), which is an opposite polarity transistor from transistor 60, the source electrode 72 must have a higher voltage than the gate electrode 70 assuming now that transistor 30 is conducting and so neither transistor 60 nor 62 is conducting at this time. With transistor 30 conducting and output terminal 14 essentially at the high voltage LHI of high rail 90, an overload current occurring will draw down output terminal 14 and with it source 66 of transistor 60. When source 66 goes down in voltage compared to gate 64, transistor 60 conducts and it conducts current from the overloaded output terminal 14. Thus, in the normal state transistor 60 and 62 draw no current.

When the output voltage at node 14 changes significantly because of an overload current, the indicated one of transistors 60 or 62 begins to conduct and it conducts a portion of the current involved in the overload. Transistors 60 and 62 are thus biased by the voltage at output terminal 14. With transistor 60 conducting, it draws down node 50 which previously was at a high level due to the input at master output enable terminal 80 and the double inversion of inverters 42 and 44. But now that high level is drawn low with node 50 going low, the output of inverter 48 will go high. The high input at OR gate 36 is delivered to gate 34 of transistor 30 and shuts it down. When the overload current at output terminal 14 subsides the source 66 voltage will rise again toward the gate 64 voltage. Transistor 60 will revert to its normal off state; it will no longer draw down node 50 which will return to its normal high level state and inverter 48 will once again provide a low level to OR gate 36 enabling transistor 30 to conduct.

If transistor 32 is conducting when the overload current occurs at output terminal 14, source electrode 72 will rise in voltage against gate electrode 70 in sense transistor 62. This causes the current diverted from the overload current to be conducted through source terminal 72 and drain terminal 74, to node 46. This raises node 46 so that inverter 44 now provides a low level at node 50. This low level input to AND gate 40 causes AND gate 40 to produce a low level at gate 38 of transistor 32 shutting it down. When the fault is removed and the overload current subsides, transistor 62, like transistor 60, will revert to the normal, non-conducting state. Node 46 will return to the low level. Node 50 will return to the high level and AND gate 40 will once again be enabled to provide the high level to gate 38 to turn on transistor 32. In this way the sensing circuit, in this case composed of two sensing transistors 60 and 62 since the output device 12 is a differential transistor pair, uses virtually no power during normal operation but merely uses the voltage at transistors 30 and 32 and normal operating levels at output terminal 14 as the biasing voltage to keep them in a substantially non-conducting state. If, and only if, an overload current condition occurs will one of these transistors 60 and 62 begin to conduct, i.e., the one associated with the conducting one of transistors 30 and 32. And when it does conduct substantial current it is using only a portion of the overload current to perform its task of changing the logic levels inside of output control circuit 18 in order to turn off the one of transistors 30 and 32 which is currently conducting during the overload current condition.

Buffer delay lines 26 and 28 and output control logic block 18 are used to ensure proper "break" before "make" timing. In normal operating mode, a first driver device (30 or 32) and it's current sensing circuitry (transistors 60 and 62, respectively) are enabled while the second driver device and its short circuit protection are disabled. After the input data signal $d_{in}$ at input terminal 16 changes, the first driver device and its short circuitry protection are disabled (e.g. $d_{in}$ goes from low to high 32 and 62 are disabled). The relative sequence of which is disabled first is not critical and thus this is a degree of freedom in design optimization. After the first ON driver device (30 or 32) and its short circuitry protection (60 or 62, respectively) has been disabled, the second driver device is enabled (e.g. $d_{in}$ goes from low to high) device 30 is enabled. The time taken between these steps is usually minimized, limited by conventional design constraints; technology used, application conditions, power consumption optimization, cost. After a further period of time to allow sufficient time for the second driver device to drive the output node to a new desired level, the second short-circuit protection device is enabled (e.g. $d_{in}$ goes from low to high) device 60 is enabled. It is the buffer delay lines 26 and 28 along with block 18 that accomplish this. Each delay line includes a pair of buffers 100a and 102a, 100b and 102b and a capacitor 104a, 104b, respectively. Other delay lines are possible using passive analog, active analog or digital delay line designs. For example, if buffers 100a, 102a, 100b, 102b are implemented with inverters the delays may act as digital delays; if implemented with resistors 100a', 102a', 100b', 102b' they may act as analog delays.

The above description demonstrates the invention's operation when shorted to voltages at the extreme of the power supplies LHI 90 and LGND 92. However, a high current could occur which would be a result of $d_{out}$ output terminal 14 being shorted to voltage levels in between LGND and LHI, that is rails 92 and 90. In that case transistors 62 and 60 would start to conduct when their gate source voltage("Vgs") is higher than their threshold voltage. By correct sizing of transistors 62 and 60 with respect to each other and the MOS devices in inverters 42 and 44, with respect to the trip points in inverters 44, 48, and AND gate 40, the circuit can detect shorts to any voltage within required output voltage trigger levels. Such trigger levels could be those for example in a JEDEC 5V CMOS logic standard where output logic low is <0.5 volts and output logic high is >4.44 volts. The JEDEC Solid State Technology Association (once known as the Joint Electron Device Engineering Council), is the semiconductor engineering standardization body of the Electronic Industries Alliance (EIA).

In normal operation when driving an off-chip capacitive load with output terminal 14, its usual for the output node 14 to change relatively slowly in response to a voltage change on input terminal 16. In this circumstance the overcurrent detection circuitry has to be selective in that it does not try to go into fault mode and "three state" the output driver. To combat this a delay is placed in the path from the input terminal 16 to the gate terminal of both sensing transistors 60 and 70. This is the function of buffer delay lines 26 and 28. The strength of the buffers 100a and 100b, 102a and 102b and the size of the capacitors 104a and 104b set the delay time of the path, but this delay element can be constructed in many other ways as is known to those skilled in the art.

The delay is also designed to perform break before make switchings of differential transistors 30 and 32 as well as a delay on the timing of the gate signals of the sensing transistors 60 and 70. This ensures that when input terminal 16 changes logic state, the one of sensing transistors 60 and 70 which was enabled, is disabled immediately, secondly the sensing transistor corresponding to the new input logic state is not enabled until the output terminal 14 has changed voltage level to that corresponding to the new logic level at input terminal 16. Therefore, the delay blocks the "break" of sensing transistor 60 before the "make" of sensing transistor 70 and conversely. This ensures the sensing transistor remains off whilst the output terminal is toggling under normal operation. If after the output terminal 14 reaches its toggled state a short is present, the current limiting circuit will then proceed to "three state" the output driving transistors. Although the outputs from OR gates 36 and 40 are indicated as logic levels on lines 20 and 22 to gates 34 and 38, respectively, this is not a necessary limitation of the invention. For example, a level shifter circuit 110, 112, FIG. 2, may be interposed between OR gate 36 and gate 34 and between AND gate 40 and gate 38, respectively, so that a more linear or analog voltage may be applied, for example to maintain the conducting transistor in some lower conduction mode instead of shutting it off completely during an overload current situation. A further example of the embodiment of level shifter circuits 110, 112 includes a DAC function.

Although thus far the description of the preferred embodiment in FIG. 2 has the output terminal 14 follow the logic level of the input terminal 16 this is not a necessary limitation of the invention, as they could be in opposite or anti-phase. Also, although upon detection of an overload current state, the output driver transistors 30 and 32 were put in to their third state, additional circuitry could be coupled to the input terminal 16 path with a sense transistor to toggle the output transistor so the correct voltage is delivered at the output terminal 14 when an excessive current fault occurs. It would also be possible to have a fast input path for normal operation logically gated with a slower path which can be overdriven by a sense transistor for short circuit protection. The output driver device 12 may be converted to an input/output driver by adding the necessary input coupling logic. Instead of effectively totally shutting of the power of the primary driver upon detection of an overload current, the driver device could be put into a low power state, for example, by clamping the gate voltage of the output driving transistors to a fixed voltage instead of simply shutting them off completely. Although the voltage coupled to the gate of the sensing transistors 60 and 70 is shown to be the input logic voltage at input terminal 16, this is not a necessary limitation of the invention. Other voltage levels could be coupled to those gates thereby allowing different fault threshold voltages, for example by using additional level shifter circuits 114, 116 in the gate circuits of transistors 60 and 62, respectively. Protective series resistors may be inserted between each of nodes 66 and 72 and output terminal 14. Level shifter circuits 110-116 may be implemented with a DAC function.

In the detailed description give, the MOS devices have had positive threshold voltages, as is conventional. As is known to those skilled in the art, MOS devices can also have near-zero or negative voltage threshold e.g. "native" threshold devices and these cal also be used in this circuit design.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An overload current limiting circuit comprising:
   an output control circuit responsive to a logic input signal for generating a control signal for driving an output device to produce at an output terminal an output signal representative of said logic input signal;
   a sense circuit responsive to said logic input signal and the output signal for sensing voltage at the output terminal indicative of a current overload and if a current overload condition occurs diverting a portion of that current to the output control circuit to change the control signal to the output device to limit the overload current, said sense circuit using virtually no power during normal operation; and
   said sense circuit includes a transistor with its gate electrode responsive to said logic input signal and its primary electrodes connected in series between the output terminal and said output control circuit.

2. The overload current limiting circuit of claim 1 in which said signal representative of said logic input signal is the same as said logic input signal.

3. The overload current limiting circuit of claim 1 further including a buffered delay line for delaying application of said logic input signal to said gate.

4. The overload current limiting circuit of claim 1 in which said control signal is a logic level signal.

5. The overload current limiting circuit of claim 1 in which said output device includes a differential pair of transistors.

6. The overload current limiting circuit of claim 5 in which said output control circuit changes the control signal to turn off the one of the differential pair of transistors which is on at the occurrence of the overload current.

7. The overload current limiting circuit of claim 3 in which said delay lines include an analog delay device.

8. The overload current limiting circuit of claim 3 in which said delay lines include a digital delay device.

9. An overload current limiting circuit comprising:
   an output control circuit responsive to a logic input signal for generating a control signal for driving an output device to produce at an output terminal a signal representative of said logic input signal;
   a sense circuit responsive to said logic input signal and the output signal for sensing voltage at the output terminal indicative of a current overload and diverting a portion of that current to the output control circuit to change the control signal to the output device to limit the overload current and cease diverting that current and automatically reset the circuit when the overload current subsides; and
   said sense circuit includes a transistor with its gate electrode responsive to said logic input signal and its primary electrodes connected in series between the output terminal and said output control circuit.

10. The overload current limiting circuit of claim 9 in which said signal representative of said logic input signal is the same as said logic input signal.

11. The overload current limiting circuit of claim 9 further including a buffered delay line for delaying application of said logic input signal to said gate.

12. The overload current limiting circuit of claim 9 in which said control signal is a logic level signal.

13. The overload current limiting circuit of claim 9 in which said output device includes a differential pair of transistors.

14. The overload current limiting circuit of claim 13 in which said output control circuit changes the control signal to turn off the one of the differential pair of transistors which is on at the occurrence of the overload current.

15. The overload current limiting circuit of claim 11 in which said delay lines include an analog delay device.

16. The overload current limiting circuit of claim 11 in which said delay lines include a digital delay device.

17. An overload current limiting circuit comprising:
an output control circuit responsive to a logic input signal for generating a control signal for driving an output device including a differential transistor pair to produce at an output terminal a signal representative of said logic input signal;
a sense circuit responsive to said logic input signal and said output signal for sensing voltage at the output terminal indicative of a current overload and diverting a portion of that current to the output control circuit to change the control signal to the output device to limit the overload current to the one of the differential transistors that is conducting land cease diverting that current and automatically reset the circuit when the overload current subsides; and
said sense circuit includes a transistor with its gate electrode responsive to said logic input signal and its primary electrodes connected in series between the output terminal and said output control circuit.

18. An overload current limiting circuit comprising:
an output control circuit responsive to a logic input signal for generating a control signal for driving an output device to produce at an output terminal a signal representative of said logic input signal;
a sense circuit responsive to said logic input signal and said output signal for sensing voltage at the output terminal indicative of a current overload and diverting a portion of that current to the output control circuit to change the control signal to the output device to limit the overload current, and cease diverting that current and automatically return to the original control signal when the overload current subsides,
said sense circuit including a transistor with its gate electrode responsive to said logic input signal and its primary electrode connected in series between the output terminal and said output control circuit.

19. An overload current limiting circuit comprising:
an output control circuit responsive to a logic input signal for generating a control signal for driving an output device to produce at an output terminal a signal representative of said logic input signal; and
a sense circuit responsive to said logic input signal and said output signal for sensing voltage at the output terminal indicative of a current overload and diverting a portion of that current to the output control circuit to change the control signal to the output device to limit the overload current and cease diverting that current and automatically return to the original control signal when the overload current subsides,
said sense circuit including a transistor with its gate electrode responsive to said logic input signal and its primary electrodes connected in series between the output terminal and said output control circuit.

* * * * *